United States Patent
Uchida et al.

(10) Patent No.: US 7,539,005 B2
(45) Date of Patent: May 26, 2009

(54) DIELECTRIC FILM PRODUCTION PROCESS AND CAPACITOR

(75) Inventors: Kiyoshi Uchida, Tokyo (JP); Kenji Horino, Tokyo (JP); Hitoshi Saita, Tokyo (JP)

(73) Assignee: TDK Corporation, Tokyo (JP)

( * ) Notice: Subject to any disclaimer, the term of this patent is extended or adjusted under 35 U.S.C. 154(b) by 300 days.

(21) Appl. No.: 11/492,943

(22) Filed: Jul. 26, 2006

(65) Prior Publication Data

US 2007/0025059 A1 Feb. 1, 2007

(30) Foreign Application Priority Data

Jul. 29, 2005 (JP) .................. P2005-221676

(51) Int. Cl.
*H01G 4/06* (2006.01)
*H01G 4/005* (2006.01)

(52) U.S. Cl. ..................... 361/311; 361/303

(58) Field of Classification Search ................. 361/311, 361/321.1, 321.2, 321.3, 321.4, 321.5, 303; 29/25.42
See application file for complete search history.

(56) References Cited

U.S. PATENT DOCUMENTS

| | | | |
|---|---|---|---|
| 5,144,527 A * | 9/1992 | Amano et al. ............ 361/321.2 |
| 6,169,049 B1 * | 1/2001 | Witham et al. .............. 501/137 |
| 6,541,137 B1 | 4/2003 | Kingon et al. |
| 7,029,971 B2 | 4/2006 | Borland et al. |
| 2005/0011857 A1 * | 1/2005 | Borland et al. ................ 216/13 |

FOREIGN PATENT DOCUMENTS

| | | |
|---|---|---|
| EP | 1 498 944 A1 | 1/2005 |
| EP | 1 551 041 A1 | 7/2005 |
| JP | A 2005-039282 | 2/2005 |
| KR | 10-0668562 B1 | 1/2007 |
| WO | WO 2004/079776 A2 | 9/2004 |

OTHER PUBLICATIONS

Laughlin et al., "Preparation of Sputtered $Ba_x Sr_{1-x})TiO_3$ Thin Films Directly on Copper," *Journal of the American Cermaic Society*, vol. 88, No. 9 (2005), pp. 2652-2654.

Ong et al., "Chemical solution deposition of biaxially oriented (Ba,Sr)$TiO_3$ thin films on <100> Ni," *Journal of Material Research*, vol. 18, No. 10, Oct. 2003, pp. 2310-2317.

J.T. Dawley et al.; "Dielectric Properties of random and (100) Oriented $SrTiO_3$ and (Ba, Sr)$TiO_3$ Thin Films Fabricated on (100) Nickel Tapes;" Applied Physics Letter, vol. 81, No. 16, Oct. 14, 2002, pp. 3028-3030.

* cited by examiner

*Primary Examiner*—Eric Thomas
(74) *Attorney, Agent, or Firm*—Oliff & Berridge, PLC

(57) ABSTRACT

A capacitor provided with a dielectric film, and a first electrode and second electrode formed sandwiching it and facing each other, wherein the dielectric film has a density exceeding 72% of the theoretical density calculated based on the lattice constant, and either or both of said first electrode and said second electrode contain at least one metal selected from the group consisting of Cu, Ni, Al, stainless steel and a nickel-based alloy.

9 Claims, 2 Drawing Sheets

DIELECTRIC FILM PRODUCTION PROCESS AND CAPACITOR

BACKGROUND OF THE INVENTION

1. Field of the Invention

The present invention relates to a dielectric film production process and a capacitor.

2. Related Background Art

Active research has been conducted in recent years on thin-film capacitors that are provided with dielectric thin-films formed on Ni foils or Cu foils (Japanese Unexamined Patent Publication No. 2005-39282, and J. T. Dawley and P. G Clem, Applied Physics Letters, 2002, Vol. 81, No. 16, p. 3028). The dielectric materials that are primarily used for dielectric thin-films are metal oxide materials such as barium strontium titanate ((Ba,Sr)TiO$_3$, abbreviated as "BST") or lead zirconate titanate ((Pb,Zr)TiO$_3$, abbreviated as "PZT"). These metal oxides are known to exhibit high dielectric constant after film formation or heat treatment in an oxidizing atmosphere. Increasing the dielectric constant can yield a capacitor with a large electrostatic capacity.

SUMMARY OF THE INVENTION

Still, when readily oxidized metals such as Ni or Cu are used as electrodes, heat treatment in an oxidizing atmosphere has been problematic because it causes the metals to be oxidized and cease to function as electrodes. Processes for forming dielectric films by heat treatment in reducing atmospheres containing hydrogen or carbon monoxide have been carried out in the conventional art, but it has not been possible to obtain dielectric films as thin-films with adequately high dielectric constant by these processes. Another problem of capacitors employing conventional dielectric films is a large leak current.

It is an object of the present invention, which has been accomplished in light of these circumstances, to provide a capacitor comprising a dielectric film capable of exhibiting sufficiently high dielectric constant. It is another object of the invention to provide a dielectric film production process that allows production of a dielectric film capable of exhibiting sufficiently high dielectric constant, while adequately inhibiting oxidation of the metal layer.

The present inventors have conducted diligent research with the aim of overcoming the problems mentioned above, and have discovered that the density of a dielectric film is a major factor affecting its dielectric constant. As a result of further research based on this knowledge, the present invention was completed.

Specifically, the capacitor of the invention is provided with a dielectric film and a first electrode and second electrode formed sandwiching it and facing each other, wherein the dielectric film has a density exceeding 72% of the theoretical density calculated based on the lattice constant, and either or both the first electrode and second electrode preferably contain at least one metal selected from the group consisting of Cu, Ni, Al, stainless steel and INCONEL (a nickel-based alloy).

In the capacitor of the invention having a dielectric film with the density specified above, the dielectric film is capable of exhibiting sufficiently high dielectric constant. Cu, Ni, Al, stainless steel and INCONEL (a nickel-based alloy) are inexpensive, and can yield a capacitor with lower cost than when using precious metals such as platinum.

The dielectric film preferably consisting of particles with a mean particle size exceeding 40 nm. This will more notably exhibit the effect of the invention in terms of high dielectric constant and low leak current. The dielectric film more preferably consisting of particles with a mean particle size of less than 150 nm. This will yield an even more excellent capacitor, especially in terms of minimized leak current.

The dielectric film preferably contains at least one compound selected from the group consisting of barium titanate, strontium titanate and barium strontium titanate. Using such metal oxides can result in sufficiently high dielectric constant even when the dielectric film is a thin-film.

The dielectric film production process of the invention comprises a precursor layer-forming step in which a precursor layer containing a dielectric material is formed on a metal layer, and an annealing step in which the precursor layer is heated for crystallization of the dielectric material in the precursor layer to form a dielectric film, wherein during at least part of the annealing step, the precursor layer is heated to 550 to 1000° C. in a reduced pressure atmosphere with a pressure of $1\times10^{-9}$ to $1\times10^3$ Pa as measured with an ionization vacuum gage.

Heat treatment in an oxidizing atmosphere has conventionally been considered necessary to obtain high dielectric constant by heat treatment of dielectric materials such as metal oxides. According to the invention, however, the annealing step is carried out in a reduced pressure atmosphere with the pressure specified above, in order to allow production of a dielectric film capable of exhibiting sufficiently high dielectric constant, while adequately inhibiting oxidation of the metal layer. The present inventors conjecture that this effect is achieved by the production process of the invention because a dielectric film with density in the range specified above can be suitably obtained in a capacitor according to the invention.

The metal layer preferably includes at least one metal selected from the group consisting of Cu, Ni, Al, stainless steel and INCONEL (a nickel-based alloy). These metals, while being inexpensive, are readily oxidized, but according to the production process of the invention it is possible to obtain a dielectric film capable of exhibiting high dielectric constant while adequately inhibiting oxidation even when using such metals.

More preferably, the metal layer comprises Cu and the precursor layer is heated in the annealing step in a reduced pressure atmosphere with a pressure of $4\times10^{-1}$ to $8\times10^{-1}$ Pa as measured with an ionization vacuum gage. Alternatively and even more preferably, the metal layer comprises Ni and the precursor layer is heated in the annealing step in a reduced pressure atmosphere with a pressure of $2\times10^{-3}$ to $8\times10^{-1}$ Pa as measured with an ionization vacuum gage. This will allow formation of a high-dielectric-constant dielectric film in a more efficient manner while adequately inhibiting volatilization of the metal layer itself.

DESCRIPTION OF THE PREFERRED EMBODIMENTS

Preferred embodiments of the invention will now be described in detail. However, it is to be understood that the invention is in no way limited to these embodiments.

Figure 1:
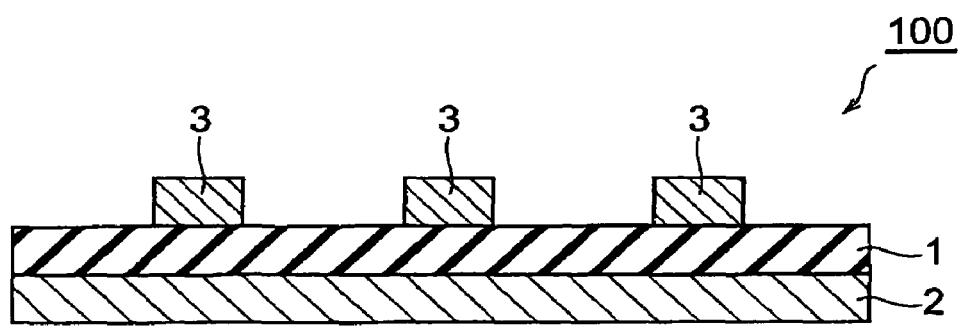
FIG. 1 is a cross-sectional view showing an embodiment of a capacitor according to the invention.

FIG. 1 is a cross-sectional view showing an embodiment of a capacitor according to the invention. The capacitor 100 shown in FIG. 1 is provided with a dielectric film 1, and a first electrode 2 and multiple second electrodes 3 formed sandwiching it and facing each other. A capacitor function is obtained at the sections where the first electrode 2 and the second electrodes 3 are facing.

The dielectric film 1 has a density exceeding 72% of the theoretical density calculated based on the lattice constant. The density of the dielectric film 1 is more preferably at least 80% and more preferably at least 85% of the theoretical density. The upper limit for this percentage is preferably as high as possible, and will usually be about 95%. The density of the dielectric film 1 may be determined, for example, by the formula: Density=(weight thickness)/(film thickness), after quantitating the weight per unit area (weight thickness) of the dielectric film 1 and the film thickness. The weight thickness may be quantitated by a method such as fluorescent X-ray analysis and the film thickness may be quantitated by a method such as cross-sectional SEM observation.

The theoretical density of the dielectric film 1 is determined from the volume of a unit lattice calculated from the lattice constant of the dielectric film 1, and the molecular weight of the compound composing the dielectric film 1 (or in the case of multiple compounds, the average molecular weight calculated in consideration of their proportions). The lattice constant of the dielectric film 1 may be determined by XRD measurement, for example.

The dielectric film 1 is formed by aggregation of particles of the dielectric material such as a metal oxide. The mean particle size of the dielectric film 1 is preferably greater than 40 nm, and more preferably 50 nm or greater. The mean particle size of the dielectric film 1 is also preferably less than 150 nm, and more preferably no greater than 130 nm.

Figure 2:
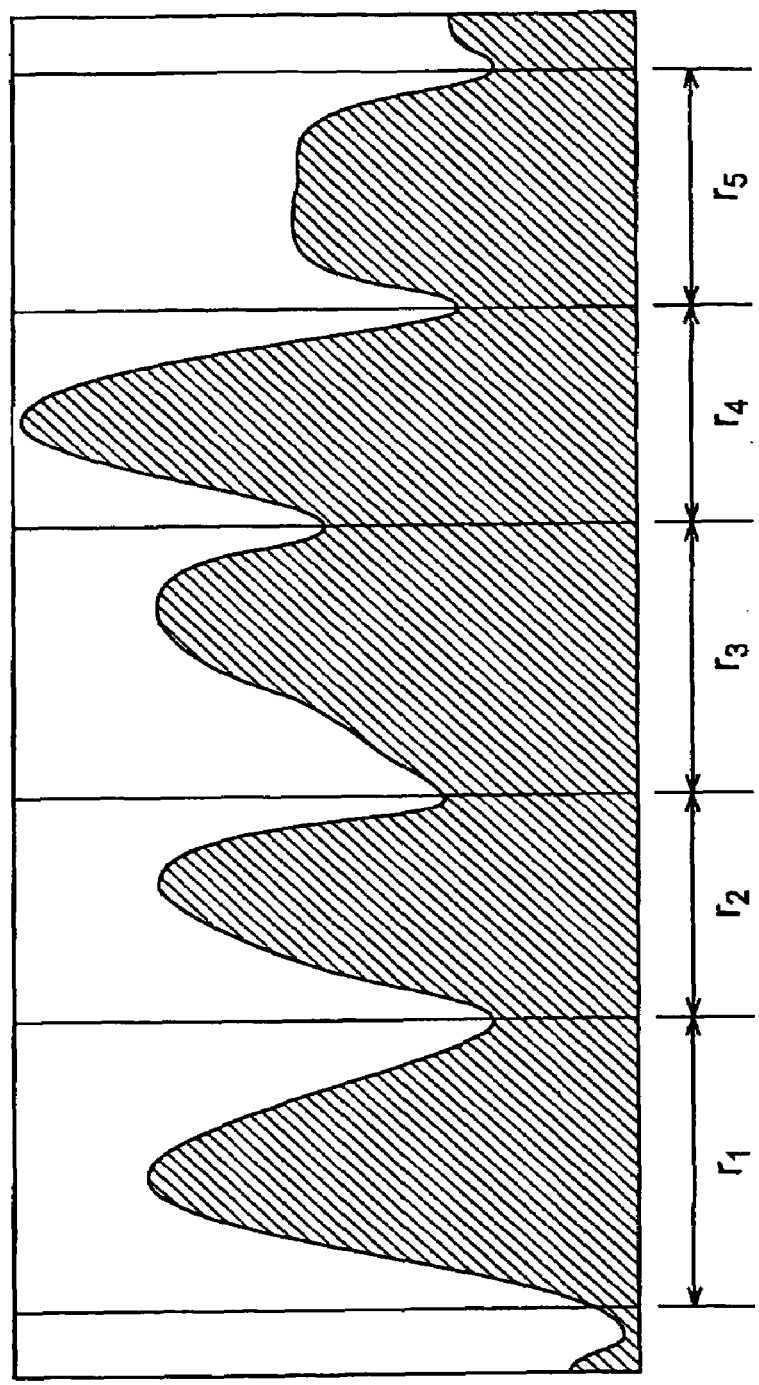
FIG. 2 is a drawing showing an example of the cross sectional image of a dielectric film obtained by AFM.

The mean particle size of the dielectric film 1 may be determined based on atomic force microscopy (AFM) of the surface of the dielectric film 1. FIG. 2 is a drawing showing an example of the cross sectional image of a dielectric film obtained by AFM. In FIG. 2, the average value for the particles sizes $r_1$, $r_2$, $r_3$, $r_4$ and $r_5$ of five arbitrarily selected dielectric particles is considered to be the mean particle size for the dielectric film 1. The number of dielectric particles selected to determine the mean particle size is preferably 5 or greater. There is no particular restriction on the upper limit for the number of particles, but usually 7 to 10 will be sufficient.

The dielectric film 1 is a "thin-film". That is, the dielectric film 1 is a dielectric thin-film. The dielectric thin-film may be formed from the dielectric material by a physical gas-phase growth method such as vacuum vapor deposition or sputtering, a chemical solution method such as a sol-gel process, or a chemical gas-phase growth method such as MOCVD. The dielectric film 1 is most preferably a film formed by a physical gas-phase growth method. The thickness of the dielectric film 1 is preferably 0.010 to 1.5 μm.

The dielectric material used for the dielectric film 1 may be a metal oxide such as barium titanate, strontium titanate, barium strontium titanate, lead zirconate titanate or the like. Of these, the dielectric film 1 preferably contains at least one compound selected from the group consisting of barium titanate, strontium titanate and barium strontium titanate.

The material composing the first electrode 2 and second electrodes 3 is not particularly restricted so long as it has sufficient conductivity to function for capacitor electrodes, but either or both of the first electrode 2 and the second electrodes 3 preferably contain at least one metal selected from the group consisting of Cu, Ni, Al, stainless steel and INCONEL (a nickel-based alloy), and more preferably contain Cu or Ni. The first electrode 2 or second electrodes 3 may also contain other metals than these. For example, when the first electrode 2 contains such metals, the second electrodes 3 may contain other metals, for example, precious metals such as Pt.

The capacitor 100 may be produced by a method wherein, for example, the dielectric film 1 is formed on a metal layer serving as the first electrode 2, and the second electrodes 3 are formed on the dielectric film 1 by a physical gas-phase growth method. The dielectric film 1 may be suitably formed by a dielectric film production process comprising a precursor layer-forming step in which the precursor layer is formed from a dielectric material by, for example, a physical gas-phase growth method, and an annealing step in which the precursor layer is heated for crystallization of the dielectric material in the precursor layer to form a dielectric film, wherein during at least part of the annealing step, the precursor layer is heated in a reduced pressure atmosphere with a pressure of $1 \times 10^{-9}$ to $1 \times 10^3$ Pa as measured with an ionization vacuum gage.

In the precursor layer-forming step, the precursor layer is formed from a dielectric material such as BST. A physical gas-phase growth method, for example, may be used for formation of the precursor layer. Sputtering is particularly preferred as a physical gas-phase growth method in this case. The dielectric material will usually be in an amorphous state in the precursor layer after film formation.

Heat treatment of the film-formed precursor layer in a reduced pressure atmosphere of $1 \times 10^{-9}$ to $1 \times 10^3$ Pa in the annealing step can yield a dielectric film 1 with high dielectric constant. Applying heat treatment under the pressure specified above, oxidation of the metal layer such as copper foil is suppressed, and the oxygen vacancy concentration of a dielectric film can be kept low. Therefore, a dielectric film capable of exhibiting high dielectric constant can be obtained without re-oxidizing a dielectric film after the annealing step. If the pressure exceeds $1 \times 10^3$ Pa, inconveniences such as accelerated oxidation of the metal layer may occur. When the metal layer is oxidized, high dielectric constant of a dielectric film tends to be difficult to be exhibited. Also, if the pressure is below $1 \times 10^{-9}$ Pa, vaporization of the metal layer will tend to take place. When the metal layer vaporizes, the leak current tends to increase. The heat treatment in the annealing step may partially include a process of heating at a pressure outside of the aforementioned pressure range, but it preferably includes a process of heating for at least 1 to 60 minutes within the aforementioned pressure range.

In most cases, the pressure in the annealing step is preferably $1 \times 10^{-5}$ to $1 \times 10^2$ Pa and more preferably $1 \times 10^{-3}$ to 10 Pa. Particularly when the metal layer is made of Cu, the pressure is preferably $4 \times 10^{-1}$ to $8 \times 10^{-1}$ Pa, and when the metal layer is made of Ni the pressure is preferably $2 \times 10^{-3}$ to $8 \times 10^{-1}$ Pa. In the annealing step, the precursor layer is heated preferably to 400 to 1000° C., more preferably to 550 to 1000° C., and still more preferably to 600 to 900° C.

The present invention will now be explained in greater detail by examples and comparative examples. However, it is to be understood that the invention is in no way limited to these examples.

Examples in Which the Annealing Steps are Carried Out Under Reduced Pressure

A BST thin-film as the precursor layer was formed by sputtering under the following conditions on an Ni foil or Cu foil as a lower electrode with a mirror-polished surface.

Base (Ni foil or Cu foil) temperature: 24° C.
Input power: 1.8 W/cm$^2$
Atmosphere: Ar+O$_2$ (33 vol %)

Film-forming time: 120 nm

Film thickness (target value): 600 nm

The obtained BST thin-film was then heated for 30 minutes at 800° C. in the case of Ni foil and at 750° C. in the case of Cu foil in a reduced pressure atmosphere with a degree of vacuum of a pressure (in terms of $N_2$) shown in tables 1 or 2 measured with an ionization vacuum gage, to form a dielectric film with advanced crystallization of BST (annealing step). Further, in the case of applying a Ni foil, dielectric films were produced in a reduced pressure of $4.0 \times 10^{-2}$ Pa at annealing temperatures shown in table 3. Tables 1 to 3 shows the pressure as the vacuum degree during initial heating in the annealing step.

Of the obtained dielectric films, the one produced with a heating temperature of 750° C. and a pressure of $4.0 \times 10^{-2}$ Pa was used for quantitation of the weight thickness (weight per unit area of the dielectric film) by fluorescent X-ray analysis, and the resulting weight thickness value (298.4 µg/cm$^2$) was divided by the value of the film thickness (588 nm) measured by cross-sectional SEM observation to determine the density of the dielectric film, which was 5.07 g/cm$^2$. Also, the lattice constant of the dielectric film was determined by XRD measurement, the unit lattice volume was calculated, and then the theoretical density for the dielectric film was calculated from the unit lattice volume and the molecular weight of BST, yielding a value of 5.76 g/cm$^2$. That is, the density of the dielectric film was 88% of the theoretical density. The density and the theoretical density was determined in the same manner for the dielectric films with the other annealing conditions.

The dielectric films were also subjected to AFM under the conditions shown below, and the AFM images were used to determine particle sizes for 7 arbitrarily selected particles, from which the averages were taken as the mean particle sizes (nm) for the dielectric films.

Probe scanning frequency: 1 Hz

Scanning area: 1 µm×1 µm

Scanning resolution: 256/µm

A platinum electrode was formed on the dielectric films, and thus capacitors are obtained. Electrical properties of obtained capacitors are evaluated.

TABLE 1

| Base temperature (° C.) | Annealing temperature (° C.) | Degree of vacuum (Pa) | Ratio to theoretical density (%) | Mean particle size (nm) | Dielectric constant | tan δ (%) | Leak current (A/cm$^2$) |
|---|---|---|---|---|---|---|---|
| 24 | 800 | $8.0 \times 10^{-10}$ | 85 | 68 | 2550 | 18 | $8.0 \times 10^{-5}$ |
|  |  | $1.0 \times 10^{-9}$ | 87 | 71 | 2500 | 15 | $2.0 \times 10^{-5}$ |
|  |  | $5.0 \times 10^{-7}$ | 90 | 65 | 2450 | 13 | $8.0 \times 10^{-6}$ |
|  |  | $4.0 \times 10^{-5}$ | 88 | 70 | 2440 | 14 | $4.5 \times 10^{-7}$ |
|  |  | $2.0 \times 10^{-3}$ | 86 | 71 | 2480 | 12 | $5.1 \times 10^{-7}$ |
|  |  | $4.0 \times 10^{-2}$ | 90 | 70 | 2463 | 11 | $4.7 \times 10^{-6}$ |
|  |  | $8.0 \times 10^{-1}$ | 88 | 72 | 2410 | 13 | $2.0 \times 10^{-6}$ |
|  |  | $2.0 \times 10$ | 87 | 68 | 1910 | 11 | $6.0 \times 10^{-7}$ |
|  |  | $3.0 \times 10^{2}$ | 85 | 65 | 1650 | 10 | $3.0 \times 10^{-8}$ |
|  |  | $1.0 \times 10^{3}$ | 85 | 70 | 1200 | 9 | $5.0 \times 10^{-8}$ |
|  |  | $2.0 \times 10^{4}$ | 88 | 71 | 400 | 9 | $3.0 \times 10^{-8}$ |

TABLE 2

| Base temperature (° C.) | Annealing temperature (° C.) | Degree of vacuum (Pa) | Ratio to theoretical density (%) | Mean particle size (nm) | Dielectric constant | tan δ (%) | Leak current (A/cm$^2$) |
|---|---|---|---|---|---|---|---|
| 24 | 750 | $2.0 \times 10^{-3}$ | 75 | 57 | 1480 | 26 | $4.0 \times 10^{-4}$ |
|  |  | $4.0 \times 10^{-2}$ | 75 | 60 | 1540 | 22 | $5.0 \times 10^{-5}$ |
|  |  | $4.0 \times 10^{-1}$ | 77 | 61 | 1510 | 15 | $8.0 \times 10^{-6}$ |
|  |  | $8.0 \times 10^{-1}$ | 74 | 55 | 1530 | 15 | $6.0 \times 10^{-6}$ |
|  |  | $2.0 \times 10$ | 73 | 58 | 1350 | 13 | $7.0 \times 10^{-7}$ |
|  |  | $3.0 \times 10^{2}$ | 75 | 53 | 1150 | 13 | $6.0 \times 10^{-8}$ |

TABLE 3

| Base temperature (° C.) | Annealing temperature (° C.) | Degree of vacuum (Pa) | Ratio to theoretical density (%) | Mean particle size (nm) | Dielectric constant | tan δ (%) | Leak current (A/cm$^2$) |
|---|---|---|---|---|---|---|---|
| 24 | 400 | $4.0 \times 10^{-2}$ | 45 | 28 | 250 | 3 | $8.0 \times 10^{-8}$ |
|  | 500 |  | 65 | 40 | 900 | 9 | $7.0 \times 10^{-7}$ |
|  | 550 |  | 73 | 44 | 1050 | 10 | $8.0 \times 10^{-7}$ |
|  | 600 |  | 78 | 45 | 1100 | 11 | $4.0 \times 10^{-7}$ |
|  | 650 |  | 83 | 46 | 1300 | 10 | $5.0 \times 10^{-6}$ |
|  | 700 |  | 85 | 48 | 1800 | 12 | $6.0 \times 10^{-6}$ |
|  | 750 |  | 88 | 50 | 2206 | 13 | $7.0 \times 10^{-6}$ |
|  | 800 |  | 90 | 70 | 2463 | 11 | $4.7 \times 10^{-6}$ |
|  | 850 |  | 91 | 130 | 3325 | 12 | $2.7 \times 10^{-6}$ |
|  | 900 |  | 93 | 148 | 4020 | 9 | $6.0 \times 10^{-6}$ |
|  | 950 |  | 93 | 145 | 4090 | 15 | $4.0 \times 10^{-5}$ |

TABLE 3-continued

| Base temperature (° C.) | Annealing temperature (° C.) | Degree of vacuum (Pa) | Ratio to theoretical density (%) | Mean particle size (nm) | Dielectric constant | tan δ (%) | Leak current (A/cm²) |
|---|---|---|---|---|---|---|---|
| | 1000 | | 95 | 147 | 4120 | 17 | $8.0 \times 10^{-5}$ |
| | 1050 | | 95 | 150 | 4130 | 20 | $3.0 \times 10^{-4}$ |

Examples in which the annealing steps are carried out in $H_2/H_2O$ mixed gas atmosphere.

Dielectric films were produced in the same manner as above, except that the atmosphere for the annealing step was an $H_2/H_2O$ mixed gas atmosphere (total pressure: 1 atmosphere) and the oxygen partial pressures were as shown in Table 4. Dielectric films were produced with annealing temperatures of 850° C. and 900° C. The obtained dielectric films and capacitors produced therefrom were evaluated in the same manner as above. The dielectric film obtained with an annealing temperature of 850° C. had a density of 4.20 g/cm³ and a theoretical density of 5.79 g/cm³, and therefore the density of the dielectric film was 72% of the theoretical density. The density of the dielectric film obtained with an annealing temperature of 900° C. was 4.20 g/cm³, which was 70% of the theoretical density. The results are shown in Table 4.

TABLE 4

| Base temperature (° C.) | Annealing temperature (° C.) | Oxygen partial pressure (Pa) | Ratio to theoretical density (%) | Mean particle size (nm) | Dielectric constant | tan δ (%) | Leak current (A/cm²) |
|---|---|---|---|---|---|---|---|
| 24 | 850 | $2.6 \times 10^{-4}$ | 72 | 40 | 190 | 1 | $5.4 \times 10^{-8}$ |
| | 900 | $2.4 \times 10^{-3}$ | 70 | 10 | 230 | 3 | $8.4 \times 10^{-9}$ |

As shown in Tables 1 to 3, it is confirmed that the dielectric films having a density exceeding 72% of the theoretical density are capable of exhibiting sufficiently high dielectric constants. However, there was a tendency that dielectric constants decreased ostensibly when the degree of vacuum in the annealing steps were diminished. This may be attributed to the fact that oxidation of a Ni foil or Cu foil in the annealing steps prevents high apparent dielectric constants from being exhibited. Also, there was a tendency that leak current increased when the degree of vacuum in the annealing steps were enhanced. This may be attributed to the vaporization of a Ni foil or Cu foil in the annealing steps. In the meanwhile, when the annealing steps were carried out in $H_2/H_2O$ mixed gas atmosphere, the dielectric constants were very low despite a low leak current, and therefore a sufficiently practical level was not achieved.

According to the present invention, there is provided a capacitor comprising a dielectric film which is capable of exhibiting sufficiently high dielectric constant. Thus, the capacitor of the invention is particularly useful as a thin-film capacitor possessing a dielectric film as the thin-film, and according to the invention the resulting thin-film capacitor has sufficiently large electrostatic capacity.

There is also provided by the invention a dielectric film production process that allows production of a dielectric film which is capable of exhibiting sufficiently high dielectric constant when used as a capacitor dielectric film, while adequately inhibiting oxidation of the metal layer.

What is claimed is:

1. A capacitor comprising:
   a dielectric film; and
   a first electrode and second electrode formed sandwiching said dielectric film and facing each other,
   wherein said dielectric film has a density exceeding 72% of the theoretical density calculated based on the lattice constant,
   wherein either or both of said first electrode and said second electrode contain at least one metal selected from the group consisting of Cu, Ni, Al, stainless steel and a nickel-based alloy, and
   wherein said dielectric film comprises particles with a mean particle size of more than 40 nm and less than or equal to 70 nm.

2. A capacitor according to claim 1, wherein said dielectric film contains at least one compound selected from the group consisting of barium titanate, strontium titanate and barium strontium titanate.

3. A capacitor according to claim 1, wherein the dielectric film has a dielectric constant of from 900 to 2463.

4. A capacitor according to claim 1, wherein the dielectric film comprises particles with a mean particle size of more than 40 nm and less than or equal to 50 nm.

5. A capacitor according to claim 4, wherein the dielectric film has a dielectric constant of from 900 to 2206.

6. A dielectric film production process which comprises:
   a precursor layer-forming step in which a precursor layer containing a dielectric material is formed on a metal layer; and
   an annealing step in which said precursor layer is heated for crystallization of said dielectric material in said precursor layer to form a dielectric film,
   wherein during at least part of said annealing step, said precursor layer is heated to 550 to 1000° C. in a reduced pressure atmosphere with a pressure of $1 \times 10^{-9}$ to $1 \times 10^3$ Pa as measured with an ionization vacuum gage,
   wherein the dielectric film has a density exceeding 72% of the theoretical density calculated based on the lattice constant, and
   wherein the dielectric film comprises particles with a mean particle size of more than 40 nm and less than or equal to 70 nm.

7. A dielectric film production process according to claim 6,
wherein said metal layer includes at least one metal selected from the group consisting of Cu, Ni, Al, stainless steel and a nickel-based alloy.

8. A dielectric film production process according to claim 6,
wherein said metal layer comprises Cu,
and said precursor layer is heated in said annealing step in a reduced pressure atmosphere with a pressure of $4 \times 10^{-1}$ to $8 \times 10^{-1}$ Pa as measured with an ionization vacuum gage.

9. A dielectric film production process according to claim 6,
wherein said metal layer comprises Ni,
and said precursor layer is heated in said annealing step in a reduced pressure atmosphere with a pressure of $2 \times 10^{-3}$ to $8 \times 10^{-1}$ Pa as measured with an ionization vacuum gage.

* * * * *